United States Patent
Nakai et al.

(10) Patent No.: US 9,305,743 B2
(45) Date of Patent: Apr. 5, 2016

(54) MARKING APPARATUS AND MARKING METHOD

(71) Applicant: KABUSHIKI KAISHA TOSHIBA, Minato-ku (JP)

(72) Inventors: Takehiro Nakai, Yokkaichi (JP); Hideki Shuto, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 22 days.

(21) Appl. No.: 14/482,520

(22) Filed: Sep. 10, 2014

(65) Prior Publication Data

US 2015/0262786 A1    Sep. 17, 2015

Related U.S. Application Data

(60) Provisional application No. 61/951,924, filed on Mar. 12, 2014.

(51) Int. Cl.
| | |
|---|---|
| *B25H 7/04* | (2006.01) |
| *B25H 7/00* | (2006.01) |
| *H01J 37/22* | (2006.01) |

(52) U.S. Cl.
CPC ............... *H01J 37/226* (2013.01); *B25H 7/04* (2013.01); *H01J 2237/2448* (2013.01)

(58) Field of Classification Search
USPC ........... 250/306, 307, 309–311, 492.2, 492.3, 250/526; 29/844, 845; 358/296, 305; 700/108, 110
See application file for complete search history.

(56) References Cited

U.S. PATENT DOCUMENTS

| | | | |
|---|---|---|---|
| 6,122,562 A | 9/2000 | Kinney et al. | |
| 2002/0134936 A1* | 9/2002 | Matsui | H01J 37/28 250/310 |
| 2011/0291692 A1 | 12/2011 | Ando et al. | |
| 2013/0134308 A1* | 5/2013 | Endo | G01N 21/9501 250/307 |
| 2013/0167665 A1* | 7/2013 | Niibori | G01N 1/286 73/863.01 |
| 2014/0084159 A1* | 3/2014 | Yaeshima | H01L 22/12 250/310 |

FOREIGN PATENT DOCUMENTS

| | | |
|---|---|---|
| JP | 4-14746 | 1/1992 |
| JP | 5-50647 U | 7/1993 |
| JP | 5-334981 | 12/1993 |
| JP | 8-304243 | 11/1996 |
| JP | 11-74163 A | 3/1999 |
| JP | 2010-182896 | 8/2010 |
| JP | 2013-114854 | 6/2013 |
| JP | 2013-140840 A | 7/2013 |

\* cited by examiner

*Primary Examiner* — Bernard E Souw
(74) *Attorney, Agent, or Firm* — Oblon, McClelland, Maier & Neustadt, L.L.P.

(57) ABSTRACT

In accordance with an embodiment, a marking apparatus includes a charged particle beam device and a marking unit. The charged particle beam device generates a charged particle beam, irradiates a sample including a laminated body with the charged particle beam, detects secondary charged particles generated from the sample, and acquires a sample image. The marking unit bores a hole reaching at least a second layer from a surface layer in the laminated body in a viewing field of the charged particle beam device.

10 Claims, 5 Drawing Sheets

MARKING APPARATUS AND MARKING METHOD

CROSS REFERENCE TO RELATED APPLICATIONS

This application is based upon and claims the benefit of U.S. provisional Application No. 61/951,924, filed on Mar. 12, 2014, the entire contents of which are incorporated herein by reference.

FIELD

Embodiments described herein relate generally to a marking apparatus and a marking method.

BACKGROUND

In failure analysis of a semiconductor device, generally, a failure part is narrowed to a narrow region by using a failure part specifying apparatus for, e.g., OBIRCH (Optical Beam Induced Resistance Change) or a PEM (Photon Emission Microscope), then the failure part is locally processed by using an FIB (Focused Ion Beam) or the like, and physical analysis is conducted with the use of observing means such as an SEM (Scanning Electron Microscope) or a TEM (Transmission Electron Microscope).

At the time of performing the physical analysis with respect to the part narrowed by the failure part specifying apparatus, since an observation image is switched from an optical image provided by an optical microscope to an SEM image provided by an electron microscope, an observation magnification or how an acquired image is seen greatly varies. As a result, an observation part becomes hard to find, a mark that can be a guide is required. Therefore, before cleaving a wafer and setting it with respect to the electron microscope, marking is carried out on the failure part specifying apparatus side, and a failure is detected by the electron microscope relying on a provided mark and a layout drawing of a sample. The sample from which a failure has been detected is cut into, e.g., a 1-square-cm small piece while using the mark provided on the failure part specifying apparatus side as a guide, and then it is subjected to a cross-sectional analysis.

If the sample is a laminated structure formed of a plurality of layers, the respective layers are sequentially delaminated from the upper side and gradually analyzed, and detailed analysis is performed from a cross-sectional direction when a failure is confirmed. If an upper layer has no problem and lower layers should be subjected to analysis, since a marking provided on the upper layer by deposition or the like disappears simultaneously with layer delamination, there is a problem that marking processing must be performed again on the failure part specifying apparatus side every time delamination occurs.

Therefore, a marking method that enables failure analysis with a high accuracy and high efficiency is demanded.

DETAILED DESCRIPTION

In accordance with an embodiment, a marking apparatus includes a charged particle beam device and a marking unit. The charged particle beam device generates a charged particle beam, irradiates a sample including a laminated body with the charged particle beam, detects secondary charged particles generated from the sample, and acquires a sample image. The marking unit bores a hole reaching at least a second layer from a surface layer in the laminated body in a viewing field of the charged particle beam device.

Embodiments will now be explained with reference to the accompanying drawings. Like components are provided with like reference signs throughout the drawings and repeated descriptions thereof are appropriately omitted.

Each of the accompanying drawings is used for promoting an explanation and an understanding of the present invention, and shapes, dimensions, ratios, and others in the respective drawings may be different from counterparts in an actual apparatus. Persons skilled in the art can appropriately subject these differences to design change while considering the following description and a well-known technology. In the following embodiment, a situation where an electron beam is used as an incident beam will be taken up and explained. However, the present invention is not restricted thereto, and a marking apparatus according to the present invention can be likewise applied to a case using an ion beam or any other charged particle beam as an incident beam.

(1) Marking Apparatus

Figure 1:
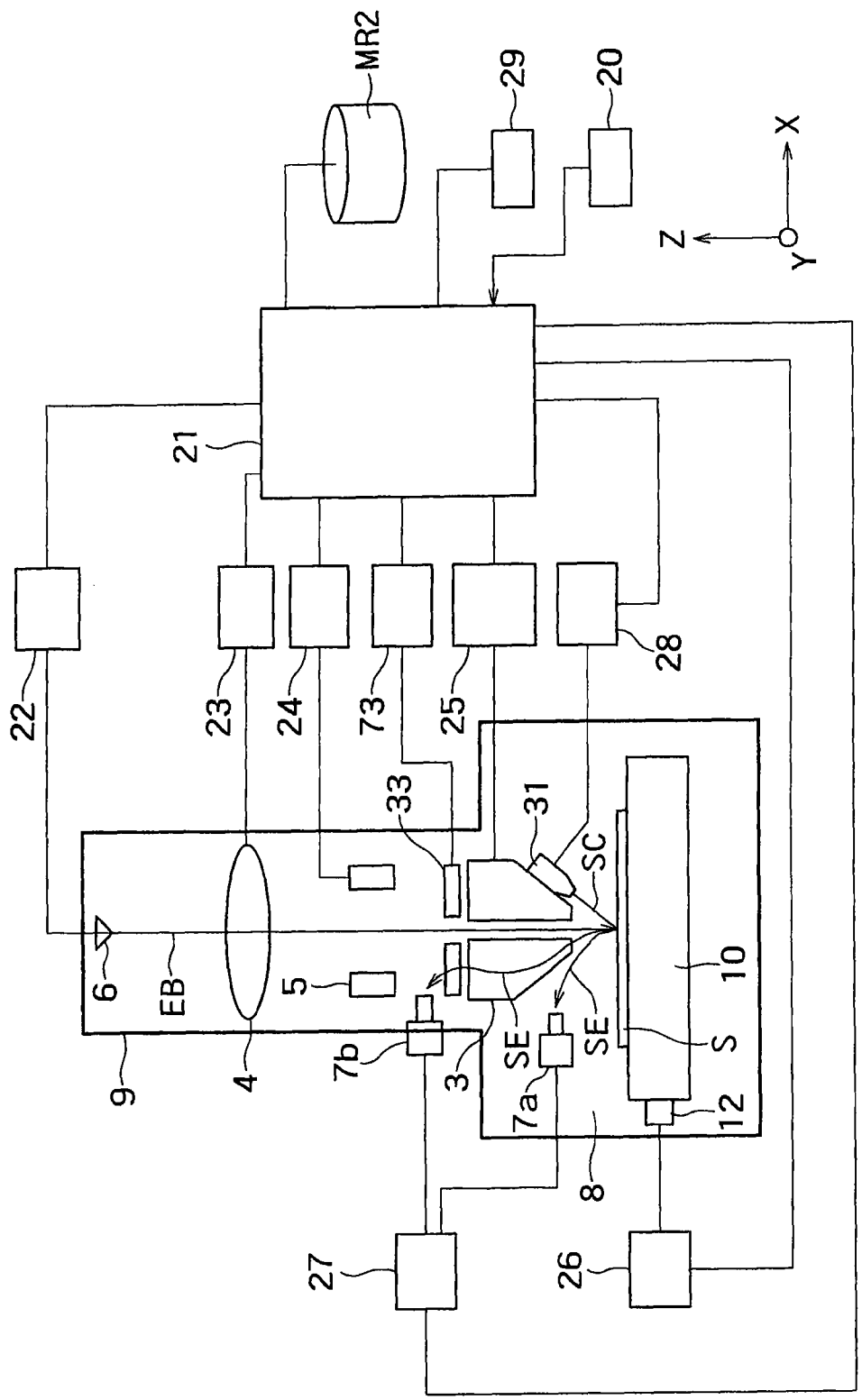
FIG. 1 is a block diagram showing an outline configuration of a marking apparatus according to an embodiment.

FIG. 1 is a block diagram showing an outline configuration of a marking apparatus according to an embodiment.

The marking apparatus shown in FIG. 1 includes a column 9, an electron gun control unit 22, lens control units 23 and 25, a deflector control unit 24, an objective lens moving mechanism control unit 73, an image generation unit 27, a stage control unit 26, a control computer 21, a scriber changing mechanism control unit 28, a memory device MR2, a display device 29, and an input device 20.

The control computer 21 is connected to the electron gun control unit 22, the lens control units 23 and 25, the deflector control unit 24, the stage control unit 26, the image generation unit 27, the scriber changing mechanism control unit 28, the objective lens moving mechanism control unit 73, the memory device MR2, the display device 29, and the input device 20.

The column 9 includes an electron gun 6, a secondary electron optical system, and a detector 7b, and a bottom portion thereof serves as a sample chamber 8. The secondary electron optical system includes a condenser lens 4, a deflector 5, and an objective lens 3.

The sample chamber 8 accommodates a detector 7a, a scriber SC, a scriber changing mechanism 31, a stage 10, and an actuator 12.

The stage 10 supports a sample S. The actuator 12 includes a screw mechanism (not shown) or the like driven by, e.g., a step motor (not shown) and moves the stage 10 in three directions, i.e., X, Y, and Z so that a desired analysis region can be placed in a viewing field.

The scriber SC is arranged in such a manner that a tip thereof can be placed between the objective lens 3 and the sample S. The scriber SC is formed of a needle of tungsten (W) having a curvature radius of approximately 10 to 100 nm at a probe tip thereof in this embodiment. A material of the scriber SC is not restricted to tungsten (W), and the scriber SC can be made of a material at least having hardness that enables boring a hole in the samples by using a tip thereof.

The scriber changing mechanism 31 has a narrow hole (not shown) that can accommodate the scriber SC and pushes out or pulls in the scriber SC in accordance with an instruction signal supplied from the scriber changing mechanism control unit 28, thereby adjusting amounts of forward and backward movements of the scriber SC. The scriber changing mechanism 31 also has an angle adjustment function and adjusts an angle between the scriber SC and a main surface of the sample S in accordance with an instruction signal supplied from the scriber changing mechanism control unit 28.

The scriber changing mechanism 31 is arranged in contact with the objective lens 3 in this embodiment. However, the scriber changing mechanism 31 is not restricted to such arrangement, and it may be arranged at any position as long as a hole can be formed in the surface of the sample S with the use of the tip of the scriber SC when the scriber SC is pushed out.

Further, an objective lens moving mechanism 33 is provided in the column 9, and the objective lens 3 is moved in a vertical direction, which is a Z direction in FIG. 1 in response to a control signal from the objective lens moving mechanism control unit 73. In this embodiment, since the scriber changing mechanism 31 is arranged in contact with the objective lens 3, the scriber SC can pierce the surface of the sample S in place of or in cooperation with an operation of the objective lens moving mechanism 33, thereby forming a hole in the sample S with the use of the tip of the scriber SC. It is to be noted that the scriber changing mechanism 31 does not have to be directly in contact with the objective lens 3, and the scriber changing mechanism 31 coupled with the objective lens 3 through any coupling mechanism can suffice.

The electron gun control unit 22 is connected to the electron gun 6, the lens control unit 23 is connected to the condenser lens 4, the lens control unit 25 is connected to the objective lens 3, the deflector control unit 24 is connected to the deflector 5, and the image generation unit 27 is connected to the detectors 7a and 7b. The stage control unit 26 is connected to the actuator 12 in the sample chamber 8.

The electron gun control unit 22 generates a control signal in accordance with an instruction of the control computer 21, and the electron gun 6 emits an electron beam EB in response to this control signal. The electron beam EB emitted from the electron gun 6 is condensed by a magnetic field or a magnetic field each generated by the condenser lens 4, then subjected to focal position adjustment by a magnetic field or a magnetic field each generated by the objective lens 3, and strikes upon the sample S.

The lens control unit 23 generates a control signal in accordance with an instruction of the control computer 21, and the condenser lens 4 condenses the electron beam EB in response to this control signal.

The lens control unit 25 generates a control signal in accordance with an instruction of the control computer 21, and the objective lens 3 adjusts a focal position of the electron beam EB in response to this control signal and allows the electron beam EB to strike upon the sample S in a just focused state.

The deflector control unit 24 generates a control signal in accordance with an instruction of the control computer 21, and the deflector 5 forms a deflected electric field or a deflected magnetic field based on the control signal supplied from the deflector control unit 24 and appropriately deflects the electron beam EB in arbitrary directions, i.e., an X direction and a Y direction, thereby scanning the surface of the sample S.

The input device 20 is an interface used for inputting data concerning a positional relationship between an estimated failure part acquired by an external failure part specifying apparatus and a mark formed by the failure part specifying apparatus as well as information such as analysis conditions, a desirable angle between the scriber SC and the surface of the sample S, and others to the control computer 21.

The control computer 21 generates various kinds of control signals and supplies them to the electron gun control unit 22, the lens control units 23 and 25, the deflector control unit 24, and the stage control unit 26. As a result, beam scanning relative to a desired analysis region on the sample S is carried out.

Secondary electrons, reflection electrons, and backscattered electrons (which will be referred to as "secondary electrons and others" hereinafter) SE are generated from the sample S by the scanning using the electron beam EB relative to the analysis region and detected by the detectors 7a and 7b, and detection signals are supplied to the image generation unit 27. The image generation unit 27 processes the detection signals from the detectors 7a and 7b and generates an SEM image of the analysis region. The generated SEM image is displayed in the display device 29 through the control computer 21 and also stored in the memory device MR2.

The actuator 12 moves the stage 10 in accordance with a control signal generated by the stage control unit 26 based on an instruction from the control computer 21.

A description will now be given as to a method of performing marking to the sample S by using the marking apparatus shown in FIG. 1 and detecting a failure with the use of the mark.

Figure 2:
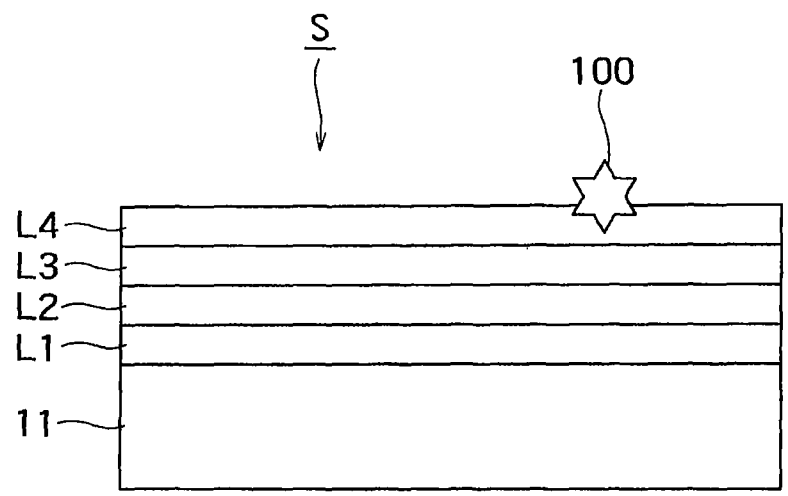
FIG. 2 is a view showing an example of a sample including a laminated body.

FIG. 2 shows a cross-sectional view of an example of the sample. In this embodiment, a laminated structure including a laminated body in which four layers L1 to L4 are laminated on a substrate 11 in the mentioned order will be taken as the sample S. The sample as a marking target of the marking apparatus according to this embodiment is not restricted to that shown in FIG. 2 as a matter of course, a laminated structure including a laminated body formed of five or more layers can suffice, but an effect of the marking apparatus according to this embodiment can be exerted if a laminated body formed of at least two layers is included. It is to be noted that reference numeral 100 denote an estimated failure part in FIG. 2.

First, failure analysis using the failure part specifying apparatus for OBIRCH or a PEM is conducted with respect to the sample S and, if a part estimated as a failure is found, marking is performed with respect to a part near the failure position on the failure part specifying apparatus side using a laser or the like (this mark will be referred to as a "preprocessing mark" hereinafter). At this stage, since the failure position in a depth direction, i.e., a Z direction in FIG. 1 is unknown, the failure position on an XY plane coordinate is specified.

Subsequently, the sample S is cleaved and formed into a chip, put into the sample chamber 8 of the marking apparatus shown in FIG. 1, and held on the stage 10, and the column 9 is subjected to vacuum drawing by using a non-illustrated vacuum pump.

Then, an SEM image is acquired in such a manner that the preprocessing mark can be placed in the viewing field. Since a scanning target is the chip separated by cleaving the wafer, the SEM image including the preprocessing mark can be easily acquired.

More specifically, the sample S is irradiated with the electron beam EB from the electron gun 6 under control of the control computer 21 through the electron gun control unit 22.

The electron beam EB is subjected to beam flux adjustment by the condenser lens 4 that receives the control signal from the lens control unit 23, also subjected to focal position adjustment by the objective lens 3 that receives the control signal from the lens control unit 73, and strikes upon the surface of the sample S11 in the just focused state.

The deflector 5 scans a desired inspection region by using the electron beam EB in response to the control signal from the deflector control unit 24. As a result, the secondary electron and others SE are discharged from the surface of the sample S and detected by the secondary electron detectors 7a and 7b, the detection signals are supplied to the image generation unit 27, and the image generation unit 27 generates an SEM image of the analysis region. The generated SEM image is supplied from the image generation unit 27 to the control computer 21, displayed in the display device 29, and stored in the memory device MR2.

Subsequently, a failure is detected by using the SEM image including the preprocessing mark. An estimated failure part is specified based on a positional relationship between the preprocessing mark and the estimated failure part input by the input device 20, the SEM image is acquired with a high magnification, and a failure is detected.

If the failure has been described from the uppermost layer, the sample S is taken out of an electron microscope, and it is subjected to a cross-section processing step to observe a shape of a cross section or analyze an element. In this case, failure detection alone is carried out in the marking apparatus according to this embodiment, and further marking is not carried out. However, in case of the sample S created based on a special layout, an estimated failure part can be specified by using an optical image and a layout drawing alone without forming a preprocessing mark in some circumstances. In such a case, even on the uppermost layer, marking is performed near an estimated failure part by using the marking apparatus according to this embodiment in accordance with a procedure described below. If a failure has not been detected from the uppermost layer, marking is performed near an estimated failure part. An instruction signal is supplied from the control computer 21 to the stage control unit 26, a control signal is supplied from the stage control unit 26 to the actuator 12 to drive the actuator 12, and the stage 10 is thereby moved by a small amount. As a result, a stage position is finely adjusted so that a desired position near a failure part can be marked.

According to this embodiment, since the scriber SC and the scriber changing mechanism 31 are provided in proximity to the objective lens 3, marking can be carried out at a desired position while observing a failure part.

Figure 3:
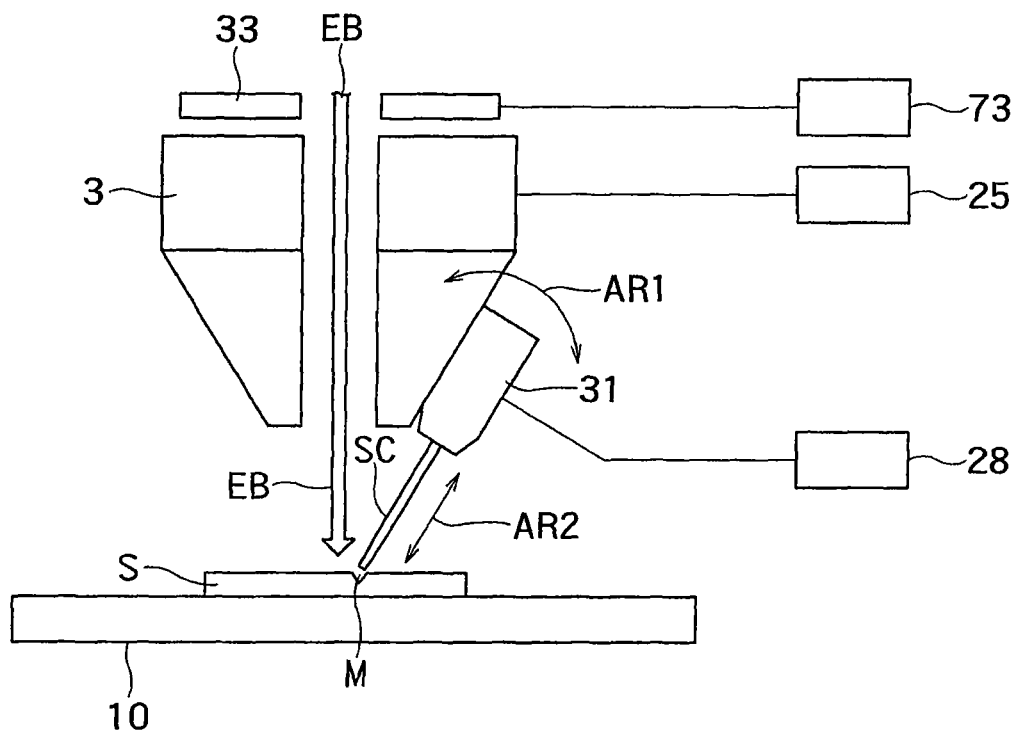
FIG. 3 is a partially enlarged view of the marking apparatus depicted in FIG. 1.

FIG. 3 is a partially enlarged view of the marking apparatus depicted in FIG. 1.

First, the scriber changing mechanism control unit 28 generates a control signal in response to an instruction from the control computer 21 and supplies it to the scriber changing mechanism 31. The control signal from the scriber changing mechanism control unit 28 includes a control signal concerning a rotation angle for adjusting an angle between the scriber SC and the sample S and a control signal concerning an amount of pushing out the scriber SC. The scriber changing mechanism 31 adjusts the angle between the scriber SC and the sample S based on rotational drive in accordance with this control signal as indicated by an arrow AR1 in FIG. 3.

Then, the scriber changing mechanism 31 pushes out the scriber SC in a direction represented by an arrow AR2 in FIG. 3 by an amount of pushing out indicated by the scriber changing mechanism control unit 28. As a result, a hole is bored at a desired position near a failure part in the laminated body of the sample S, and an impression M is formed. When the impression M is formed, the scriber changing mechanism 31 pulls in and accommodates the scriber SC in accordance with an instruction signal from the scriber changing mechanism control unit 28. Information of a positional relationship between the specified failure part and the impression M, i.e., information indicating in which direction the impression M is formed and how far the same is separated from the failure part is stored in the memory device MR2 through the control computer 21.

As described above, since the scriber SC is retractable by the scriber changing mechanism control unit 28, the scriber SC does not obstruct the viewing field at the time of observation. In this embodiment, the scriber changing mechanism 31 corresponds to, e.g., a marker moving mechanism.

Figure 4:
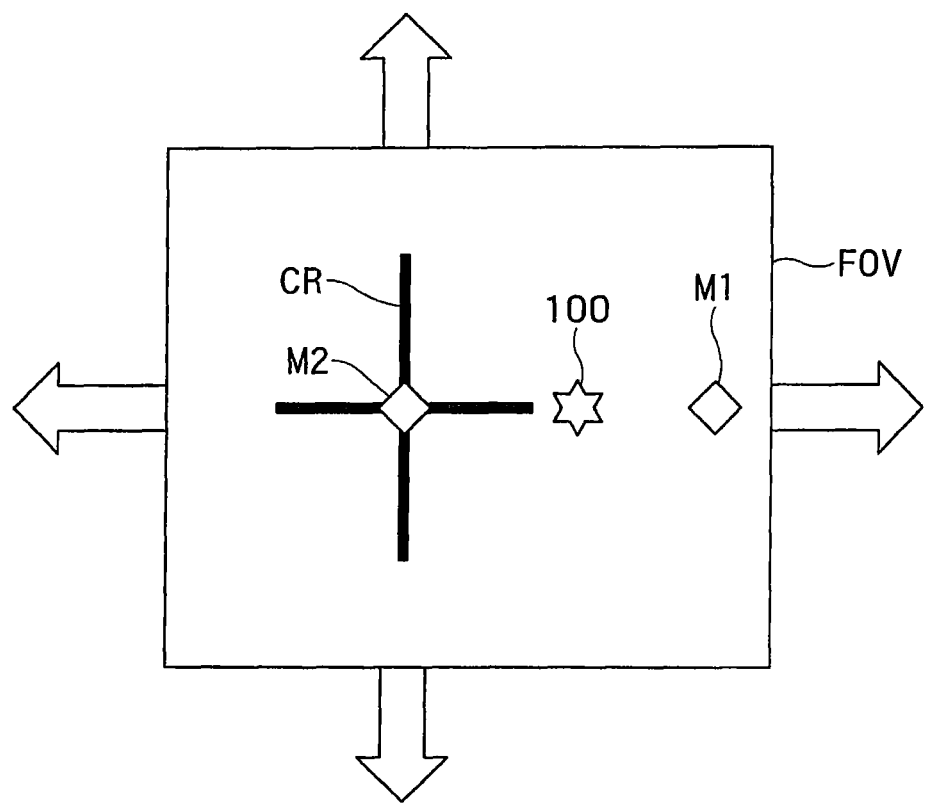
FIG. 4 and FIG. 5 are explanatory views of an analysis method using the marking apparatus depicted in FIG. 1.

FIG. 4 is a plan view showing an example of marking using the scriber SC. In the example shown in FIG. 4, an impression M1 is formed on a right side of the drawing near a failure part 100.

Marking is not restricted to a hole formed by a single pressing operation of the scriber SC, and it may be a linear groove or a scribing line based on a combination of the linear grooves. Such a linear groove can be easily formed by moving the stage 10 while keeping pressing the tip of the scriber SC against the sample surface. For example, a cross scribing line CR shown in FIG. 4 can be formed by sequentially moving the stage 10 in directions of arrows in FIG. 4 while pressing the tip of the scriber SC against the sample surface and keeping an impression M2.

Figure 5:
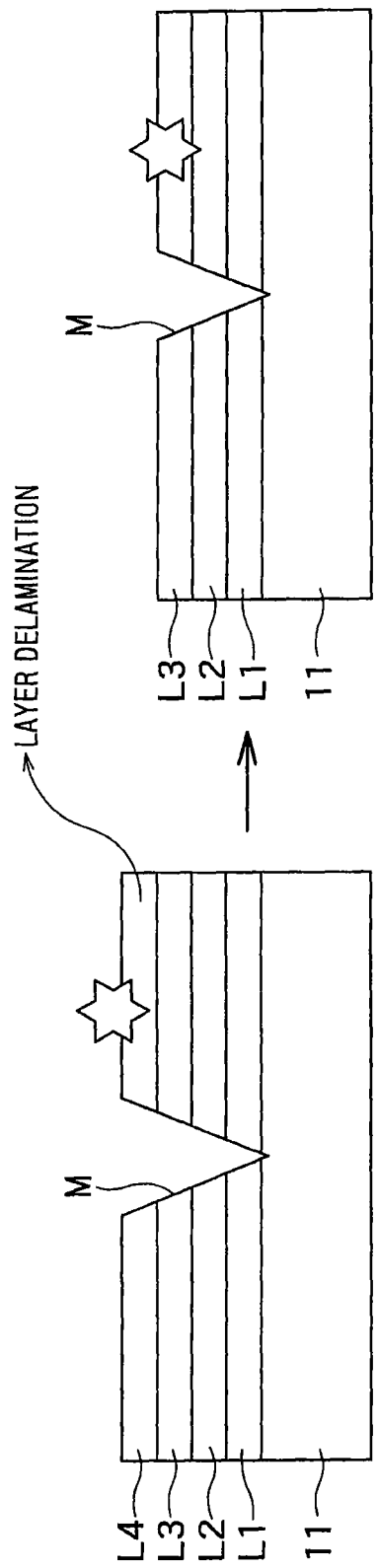

An amount of pushing out the scriber SC, i.e., a depth of the impression or the scribing line is not restricted in particular. However, except for a case that the sample has been created based on a special layout as will be described later, marking is performed when a failure is not detected on the sample surface by observing a first SEM image. Thus, a depth of a mark must be a depth that reaches the second layer that is numbered from the surface even though it is shallow, and a depth that reaches the first layer numbered from the substrate 11 side, i.e., the deepest layer in the laminated body is preferred. Furthermore, as a depth of the impression or the scribing line, a depth that pierces through the laminated body and reaches the substrate 11 is desirable. A depth that reaches a layer L3 is preferred even if it is shallow in the example shown in FIG. 2, and a depth that reaches a surface of the substrate 11 beyond the deepest layer L1 is most desirable as shown on the left side of FIG. 5.

A pushing operation of the scriber SC is not restricted to driving of the scriber changing mechanism 31, and it can be also realized by pushing down the object lens 3 toward the sample S side. In this case, the angle between the scriber SC and the sample S is adjusted by the scriber changing mechanism 31, then the objective lens movable mechanism control unit 73 sets an amount of movement based on an instruction from the control computer 21, generates a control signal, and supplies it to the objective lens moving mechanism 33.

The objective lens moving mechanism 33 pushes down the objective lens 3 toward the sample S side by the set amount in accordance with the control signal from the objective lens moving mechanism control unit 73, a hole is thereby bored in the sample S, and the impression M is formed. It is to be noted that the scriber SC can be also pushed out in cooperation with the scriber changing mechanism 31 and the objective lens moving mechanism 33 as required.

In this embodiment, the scriber SC, the scriber moving mechanism control unit 28, the scriber changing mechanism 31, the objective lens 3, and the objective lens moving mechanism 33 correspond to, e.g., a marking unit.

When a failure is not detected on the outermost surface of the sample S by observing the first SEM image, to detect a failure of lower layers, layer delamination is carried out. In the example shown in FIG. 5, marking (the impression M) using the scriber SC is performed near an estimated failure part, a layer L4 which is the outermost layer is delaminated by chemical etching, dry etching, polishing, or the like, thereby exposing a layer L3 which is a lower layer. Then, an SEM image of the layer L3 including the impression M formed by the scriber SC is acquired, information indicative of a positional relationship between a failure part and the impression M is fetched from the memory device MR2. Then presence/absence of a failure is analyzed based on the fetched information of the positional information, a layout drawing of the layer L3, and others.

When a failure is not detected from the outermost layer after the layer delamination, the layer delamination and the SEM image observation are repeated until the failure is detected. If a failure part is detected from any analysis target layer, the analysis using the marking apparatus according to this embodiment is finished, and the sample S is taken out of the sample chamber 8 and subjected to the cross-section processing step. In the cross-section processing, a sample is cut out while using the impression M as a guide, and detailed cross-sectional analysis using a TEM or the like is carried out.

There is a deposition method as a first reference example of the technique of performing marking near an estimated failure part. This is a technique of performing deposition with respect to a protective film of, e.g., tungsten or carbon by using an FIB at the time of observing an analysis part in observation of a sample from an upper surface thereof with the use of an optical image by the failure part specifying apparatus. A sample is cleaved, formed into a chip, and set to an electron microscope and, if a failure is detected by SEM observation performed from an upper surface, the sample that has been through marking is taken out from the electron microscope and subjected to the cross-section processing step to perform shape observation or element analysis of a cross section. A mark formed on the sample by the deposition serves as a guide at the time of the cross-section processing.

According to this technique, when a failure is not placed on the uppermost layer but on a layer lower than the uppermost layer, since the failure is not detected by the SEM observation from the upper surface, this layer is delaminated, and the lower layer is exposed and analyzed, but the mark that has been already formed by the deposition is also removed at the time of the delamination. Therefore, marking must be again performed for a next observation layer. As a result, the number of analysis operation steps is increased due to the repeated marking.

There is a technique of forming a physical processing trace on a sample as a second reference example of marking. This uses, e.g., an optical microscope or a failure analysis apparatus provided with a laser marking function.

However, marking in this technique is performed with a magnification of the optical microscope, and hence a positional accuracy is not enough. Moreover, in the laser marking, since processing damage to the sample is considerable, separation of at least micron order from an analysis part is necessary. Therefore, an extra time is required to find an analysis part where FIB processing or electron microscope observation is effected after the marking. Additionally, there is concern that processing contamination at the time of laser marking brings about obstacles to subsequent analysis.

On the other hand, according to the marking apparatus of at least one embodiment described above, since a marking sign can be formed even on the substrate below the laminated body by using the scriber, a position of a failure part can be specified without performing further marking. As a result, the unnecessary number of operation steps can be eliminated, and hence analysis efficiency can be improved. Consequently, an effect of improving the manufacturing process or enhancing process in a shorter turnaround time can be provided. This effect becomes greater as the number of the laminated layers to be analyzed increases.

Further, according to the marking apparatus of at least one embodiment described above, since a hole is formed with the use of the scriber, marking with a high accuracy and less concern about contamination can be carried out.

(2) Marking Method

A marking method according to an embodiment will now be described with reference to FIG. 6.

Figure 6:
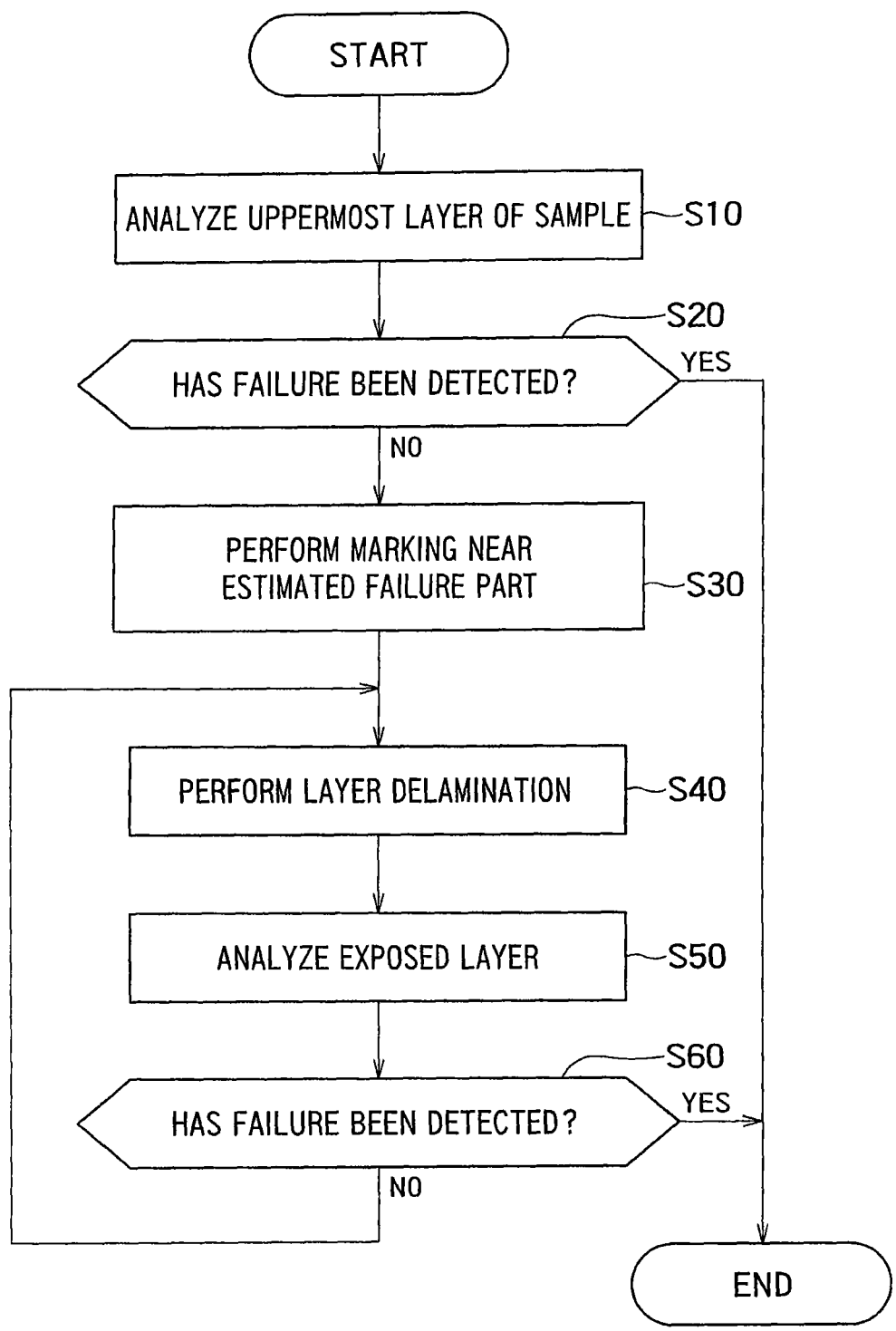
FIG. 6 is a flowchart showing outline steps of an analysis method including a marking method according to an embodiment.

FIG. 6 is a flowchart including outline steps of an analysis method including the marking method according to this embodiment.

First, as preprocessing, a failure part on a substrate having a sample including a laminated body formed thereon is estimated by failure analysis using the failure part specifying apparatus for, e.g., OBIRCH or a PEM, and a preprocessing mark is formed near the estimated part by laser marking or the like. The substrate having the preprocessing mark formed thereon is taken out of the failure part specifying apparatus and cleaved to be formed into a chip, and it turns to a sample having the preprocessing mark thereon.

Subsequently, the sample is set in the electron endoscope to analyze whether the uppermost layer of the sample has a failure (a step S10).

More specifically, first, scanning using an electron beam is performed with a low magnification, and an SEM image is acquired. Since a scanning target is the chip, the preprocessing mark can be easily confirmed within the obtained SEM image. Then, the sample is moved so that the preprocessing mark is placed at a desired position in the viewing field, and an SEM image with a high magnification is acquired.

Since a rough positional relationship between the preprocessing mark and the estimated failure part is known at the stage of forming the preprocessing mark, the estimated failure mark is specified within the SEM image by making reference to a layout drawing of the uppermost layer, thereby determining whether the failure is present (a step S20). It is to be noted that, at the time of specifying the estimated failure part, reference can be also made to an optical image provided by the failure part specifying apparatus.

As a result of analysis using the SEM image, if the failure has been detected from the uppermost layer (the step S20, YES), since further marking does not have to be performed, the sample is taken out of the electron microscope. As a result, analysis using the electron microscope is finished. The taken-out sample is subjected to the cross-section processing step of performing shape observation or element analysis of a cross section. However, in case of the sample created based on a special layout, an estimated failure part can be specified by using an optical image and a layout drawing alone without forming the preprocessing mark in some circumstances. In such a case, even on the uppermost layer, marking is performed by forming a hole at a desired position on the sample near the estimated failure part with the use of the scriber. In this case, an impression formed by the scriber serves as a mark for the cross-section processing.

On the other hand, as a result of analysis using the SEM image, if the failure has not been detected from the uppermost layer (the step S20, NO), marking is performed by forming a hole at a desired position on the sample near the estimated failure part with the use of the scriber while observing the SEM image of the sample (a step S30).

At the time of marking, the scriber, which has a tip made of a material with higher hardness than that of any layer in the laminated body, is used to form a hole until it reaches the second layer from the surface of the laminated body or preferably the deepest layer in analysis target layers in the laminated body except for the above-described special case. Furthermore, at the time of marking, it is desirable to form a hole until it reaches the substrate below the laminated body. That is because a wiring line of the uppermost layer in the laminated body may be possibly connected to a wiring line or the like on a substrate surface layer and layer delamination analysis may be performed even to the substrate surface layer.

Then, the sample is taken out of the electron microscope, and the outermost surface layer is delaminated by chemical etching, dry etching, polishing, or the like to expose a lower layer (a step S40).

Subsequently, the sample is returned to the electron microscope, an SEM image of the exposed layer is acquired, and whether a failure part is present is again analyzed (a step S50).

More specifically, the SEM image is acquired in such a manner that an impression formed by the scriber is placed at a desired position in the viewing field.

Since a rough positional relationship between the estimated failure part specified by previous analysis using the SEM image and the impression is recognized in advance, the estimated failure part is specified in the SEM image by making reference to a layout drawing of a corresponding layer, and presence/absence of a failure is determined. At the time of specifying the estimated failure part, reference can be also made to an optical image provided by the failure part specifying apparatus.

When a failure is not detected (the step S60, NO), the layer delamination and the SEM image observation are repeated until the failure is detected (the steps S40 and S50). If the failure is detected from any analysis target layer (the step S60, YES), the sample is taken out of the electron microscope. As a result, analysis using the electron microscope is finished. The taken-out sample is subjected to the cross-section processing for performing shape observation or element analysis of a cross section.

According to the marking method of at least one embodiment described above, since a hole is formed by using the scriber, marking with a high accuracy and less concern about contamination can be carried out.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A marking apparatus comprising:
   a charged particle beam device configured to generate a charged particle beam, irradiate a sample comprising a laminated body with the charged particle beam, detect secondary charged particles generated from the sample, and acquire a sample image; and
   a marking unit configured to form a hole which reaches at least a second layer from a surface layer in the laminated body in an observation viewing field of the sample provided by the charged particle beam device.

2. The apparatus of claim 1,
   wherein the marking unit comprises a scriber having at least a tip made of a material with higher hardness than that of the laminated body.

3. The apparatus of claim 2,
   wherein the marking unit comprises a marker moving mechanism configured to adjust an angle of the scriber relative to a surface of the sample.

4. The apparatus of claim 3,
   wherein the scriber is movable in forward and backward directions, and
   the marker moving mechanism is further configured to adjust amounts of forward and backward movements of the scriber.

5. The apparatus of claim 2, further comprising a stage configured to move the sample in arbitrary directions while the scriber is being stuck in the sample.

6. The apparatus of claim 2,
   wherein the charged particle beam device comprises an objective lens configured to adjust a focal position of the charged particle beam,
   the scriber is arranged to be coupled with the objective lens, and
   the marking unit comprises an objective lens moving mechanism configured to adjust amounts of forward and backward movements of the scriber by adjusting a distance between the objective lens and the sample.

7. A marking method comprising:
   forming a mark configured to specify an estimated failure part by forming a hole which reaches at least a second layer from a surface layer in a laminated body while observing an SEM image of a sample comprising the laminated body.

8. The method of claim 7,
   wherein the hole is formed so as to reach the deepest layer in the laminated body.

9. The method of claim 7,
   wherein the hole is formed to pierce through the laminated body.

10. The method of claim 7,
    wherein a planar shape of the mark comprises a point shape and a linear shape.

\* \* \* \* \*